(12) United States Patent
Harano et al.

(10) Patent No.: US 6,676,766 B2  
(45) Date of Patent: Jan. 13, 2004

(54) METHOD FOR CLEANING A SUBSTRATE USING A SHERBET-LIKE COMPOSITION

(75) Inventors: Riichiro Harano, Kawasaki (JP); Masami Furusawa, Kawasaki (JP); Satoshi Joya, Kawasaki (JP)

(73) Assignee: Sprout Co., Ltd., Kawasaki (JP)

( * ) Notice: Subject to any disclaimer, the term of this patent is extended or adjusted under 35 U.S.C. 154(b) by 230 days.

(21) Appl. No.: 09/846,371

(22) Filed: May 2, 2001

(65) Prior Publication Data  
US 2001/0037818 A1 Nov. 8, 2001

(30) Foreign Application Priority Data  
May 2, 2000 (JP) ............................ 2000-133350

(51) Int. Cl.[7] .............................................. B08B 7/00
(52) U.S. Cl. ............ 134/7; 134/2; 134/6; 134/25.5; 134/32; 134/34; 134/37; 134/902; 438/906; 451/38; 451/39; 451/60; 510/175
(58) Field of Search ............ 134/2, 6, 7, 25.5, 134/32, 34, 37, 902; 451/38, 39, 60; 510/175; 438/906

(56) References Cited

U.S. PATENT DOCUMENTS 5,009,240 A * 4/1991 Levi ............................ 134/7
5,035,750 A * 7/1991 Tada et al. ............... 438/472
5,081,068 A * 1/1992 Endo et al. ................ 134/2
5,147,466 A * 9/1992 Ohmori et al. ............ 134/7

FOREIGN PATENT DOCUMENTS

| JP | 63029515 | * | 2/1988 |
| JP | 6-182306 | * | 7/1994 |
| JP | 07201795 | | 8/1995 |
| JP | 11151467 | | 6/1999 |

OTHER PUBLICATIONS

Chemical Fact Sheet. Spectrum Laboratories. Cas#67561.*  
Precise Engineering Association; Special Committee for Studying the Planarization Process; The 10th Round Material for Society, Nov. 5, 1999; and translation.

* cited by examiner

Primary Examiner—Randy Gulakowski  
Assistant Examiner—M. Kornakov  
(74) Attorney, Agent, or Firm—Jacobson Holman PLLC

(57) ABSTRACT

A method for cleaning a substrate with sherbet-like composition, comprising mixing the liquid organic agent and pure water in a mixing vessel to form a mixture, supercooling the mixture uniformly at a predetermined temperature while stirring the mixture, wherein the stirring includes creating vortices in the mixture, growing the vortices and diffusing the grown vortices in the mixture, thus providing sherbet-like cleaning composition and moving the sherbet-like cleaning composition relative to the substrate to be cleaned.

11 Claims, 9 Drawing Sheets

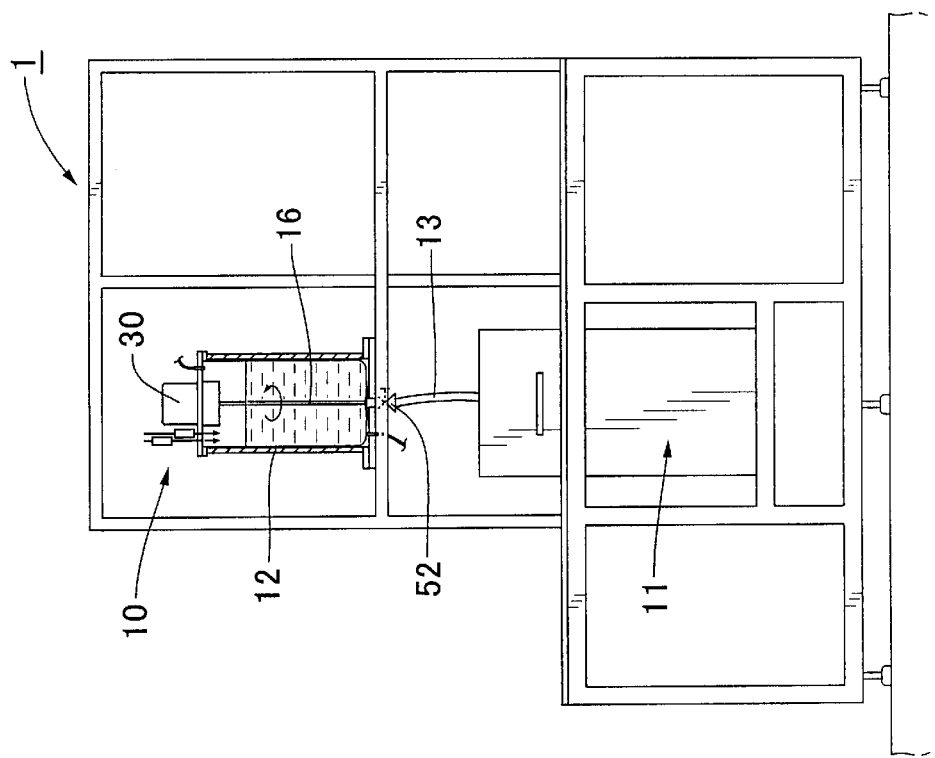
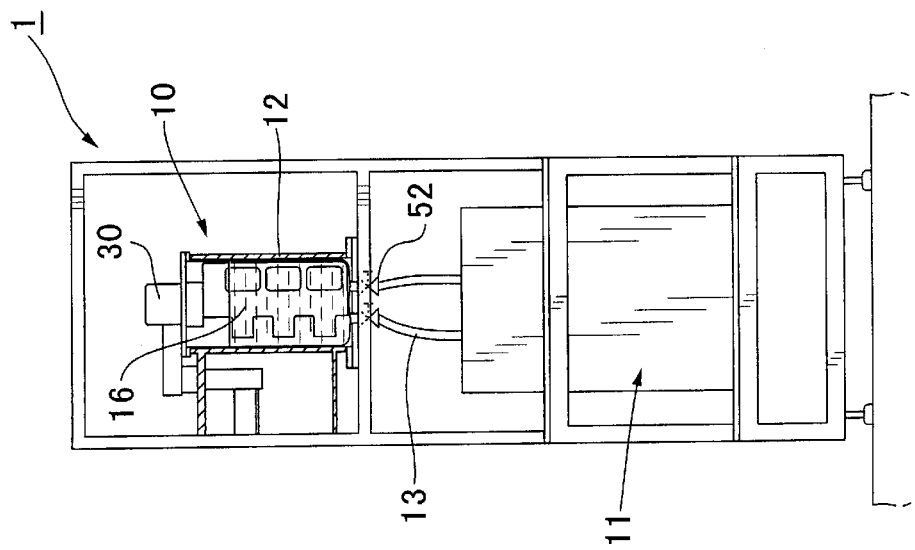

METHOD FOR CLEANING A SUBSTRATE USING A SHERBET-LIKE COMPOSITION

BACKGROUND OF THE INVENTION

Field of the Invention

The present invention relates to a method and system for cleaning a substrate, such as a semiconductor wafer, a substrate for a liquid crystal display (LCD), a glass substrate for use in manufacture of a plasma display panel (PDP) or the like as well as a method and apparatus for making a sherbet-like cleaning composition for cleaning of the substrate.

In Japanese Patent Laid Open No. 11-151467 in the name of the assignee, a method and system for cleaning a substrate by scrubbing has been proposed.

The proposed system comprises an apparatus for producing snow ice crystal grains of a predetermined size, holder means for holding a substrate to be cleaned, supply means for separately supplying to the substrate the snow ice grains for mechanical cleaning of the substrate and a chemical agent for chemical cleaning of the substrate to form a sherbet-like aggregate over each of the opposite surfaces of the substrate, means for urging the sherbet-like aggregate against the opposite surfaces of the substrate and means for moving the aggregate relative to the substrate surfaces. The snow ice producing apparatus is a cyclone type one and is constructed in such a manner that the ice crystals are created by injecting cooling air into the cyclone chamber, as is well-known to those skilled in the art.

In view of the fact that the chemical cleaning of the substrate surfaces may be accomplished by the chemical agent and also the mechanical cleaning thereof can be effected by the scrubbing action of the snow ice grains during the movement of the sherbet-like aggregate relative to the substrate while urging the aggregate against the substrate surfaces, the proposed cleaning system can provide effective and efficient cleaning of the substrate without causing any appreciable damage thereto. In the following description, this process will be referred to as a "scrubbing cleaning process".

However, the conventional scrubbing cleaning process as described above has the following drawbacks:

Firstly, after the semiconductor wafer is subject to a polishing process, in particular, chemical-mechanical polishing (CMP) and then often exposed to pure water, numerous contaminant particles can be found on the polished wafer surfaces. Typically, these particles are adhered to the wafer surfaces mainly due to the effect of the surface tension force of the pure water remaining thereon. A greater scrubbing or shearing force is required in order to remove the particles from the wafer surfaces to overcome the surface tension force of the pure water. On the other hand, the increased scrubbing force resulting from the movement of the sherbet-like aggregate relative to the substrate can adversely affect the polished wafer surfaces, depending on the type of the substrate and the amount of the scrubbing force applied on the substrate surfaces.

Secondly, it is difficult to provide the aggregate of the snow ice grains and the chemical agent with the desired characteristics, for example, a suitable consistency. Also, it is necessary to control the size of the snow ice grains in accordance with the type of the substrate to enable efficient scrubbing and cleaning of the substrate. More specifically, in view of the fact that microscopic surface asperities can vary in size in accordance with the type of the substrate, it is important that the snow ice grains have a size substantially smaller than that of the depressions of the substrate surfaces in order to enable to be removed or scrapped dust particles entrapped in the pits of the substrate surfaces. As can be appreciated by those skilled in the art, oversized snow ice grains may fail to remove the dust particles from the substrate surfaces.

The scrubbing cleaning process utilizes an on-site mixing at the substrate surfaces where the properly sized snow ice grains and the chemical agent are mixed to produce a sherbet-like material for chemical and mechanical cleaning of the wafer. Such an on-site mixing may not provide enough control to obtain sherbet having the desired nature or consistency than an off-site mixing process. Also, it is somewhat difficult to control the size of the snow ice grains after the on-site mixing. Further, the on-site mixing process may prevent effective production of the sherbet-like material.

Thirdly, in the conventional snow ice making apparatus, a heat exchange between the spray of the pure water and the cooling gas is brought about by a heat conduction, i.e., via a direct contact of this spray with the cooling gas within the cyclone chamber. The effectiveness of heat exchange depends on various factors, for example, the time during which the pure water spray is in contact with the cooling gas and the contact area therebetween. As a practical matter, successful control of these factors is difficult. Further, the ice snow grains tend to adhere to the inner wall of the cyclone chamber to grow into a block or column of ice thereon, which black or column of ice may prevent the heat exchange between the water spray and the cooling gas as it creates an impedance to the rotational movement thereof within the cyclone chamber, thereby make it difficult to establish a suitable contact timelength and a contact area amount, which in turn may also contribute to reducing heat exchange effectiveness. Such a process and the on-site mixing process can result in inefficient production of the sherbet-like material.

Supercooling of the pure water in a mixing vessel to below its freezing point by use of an external cooling means does not contribute to improving the effectiveness of making the sherbet-like material because the ice crystals tend to form simultaneously on the cooled inner wall of the chamber which the pure water comes into contact with, to grow into a block of ice all over this inner wall overtime rather than to grow into ice grains.

SUMMARY OF THE INVENTION

It is therefore an object of the present invention to provide a new method and apparatus for making a sherbet-like cleaning composition having the characteristics suitable for the type of the substrate to be scrubbed and cleaned.

It is another object of the present invention to provide a new method and system for cleaning a substrate in an efficient and effective manner using the sherbet-like cleaning composition while avoiding the limitations of the conventional method and system as described above.

With these above objects in mind, the present invention provides a method for cleaning a substrate, comprising the steps of providing a sherbet-like cleaning composition consisting of snow ice crystal grains and a liquid organic chemical agent and moving the sherbet-like cleaning composition relative to the substrate to be cleaned along at least one of the surfaces thereof, the organic chemical agent of the composition operating to reduce the adhesion of residual particles to the at least one surface of the substrate, the sherbet-like cleaning composition having a consistency allowing the particles on the at least one surface of the substrate to be entrained therein to thereby enable the particles to be removed from the at least one surface of the substrate.

Preferably, the step of providing the sherbet-like composition includes the steps of mixing the liquid organic agent and pure water in a predetermined mixing ratio in a mixing vessel to form a mixture, and supercooling the mixture uniformly therethroughout at a predetermined temperature lower than the freezing point of the pure water and greater than that of the organic chemical agent while stirring the mixture in a manner permitting the pure water to change into snow ice crystal grains.

Preferably, the stirring step includes the steps of creating vortices in the mixture, growing the vortices and diffusing the grown vortices in the mixture.

Preferably, the step of providing the sherbet-like composition can further comprise the step of controlling the mixing ratio and/or the degree of supercooling of the water that produce the snow ice particles having a predetermined ratio by volume in the pure water, and thus the sherbet-like composition produced has a predetermined consistency.

Further, the step of providing the sherbet-like composition further comprises the step of detecting a stirring torque applied on the mixture in the mixing vessel and controlling the degree of supercooling of the mixture in accordance with the detected torque in a manner so that the sherbet-like composition produced has of a predetermined consistency.

The present invention also provides a method for cleaning a substrate by means of a sherbet-like composition containing snow ice grains and a liquid chemical agent, comprising the steps of providing the sherbet by mixing the liquid chemical agent and pure water in a predetermined mixing ratio to form a mixture and then supercooling the mixture uniformly therethroughout while stirring the mixture at a predetermined temperature lower than the freezing point of the pure water and greater than that of the chemical agent to produce a sherbet-like composition having the characteristics suitable for scrubbing and cleaning the substrate, and urging the sherbet against at least one of the surfaces of the substrate while effecting relative movement between the sherbet-like composition and the substrate to scrub the at least one of the surfaces of the substrate to clean it.

Preferably, the step of providing the sherbet-like composition can further comprise the step of controlling the mixing ratio and/or the degree of supercooling of the mixture so that the snow ice grains contained in the sherbet-like composition have a controlled size.

Preferably, the stirring step further includes the steps of creating vortices in the mixture, growing the vortices and diffusing the grown vortices in the mixture.

The chemical agent may include organic chemicals, alkaline chemicals, acid chemicals or any combination thereof.

Preferably, during cleaning of the substrate, the substrate can be rotated and reciprocated.

The present invention also provides a system for cleaning a substrate, comprising an apparatus for producing a sherbet-like composition consisting of snow ice grains and a chemical agent, holder means for holding a substrate to be cleaned, supply means for supplying to the substrate the sherbet-like composition for cleaning of the substrate, and means for moving the sherbet-like composition being supplied relative to the at least one of the surfaces of the substrate, the apparatus for producing the sherbet-like composition comprising a mixing vessel for mixing the chemical agent and pure water in a predetermined mixing ratio to form a mixture, means for supercooling the mixture uniformly therethroughout at a predetermined temperature lower than the freezing point of the pure water and greater than that of the chemical agent, an impeller blade having a generally vertically extending axis of rotation for stirring the mixture uniformly within the mixing vessel to produce a sherbet-like composition, the impeller blade having side edges which are each located so that there is sufficient gap between each edge and the inner wall of the mixing vessel to prevent the edges from coming into contact with the inner wall of the mixing vessel, during the rotation of the impeller blade, the sherbet-like composition being used to remove particles from the at least one of the surfaces of the substrate.

Preferably, the impeller blade comprises a contoured plate member having first and second side edges located opposite from the axis of rotation, the first side edge extending in a direction parallel to the vertical axis of rotation of the impeller and the second side edge being formed to have a sawtooth waveform shape. The impeller blade has passage means extending in a direction parallel to the vertical axis of rotation and located adjacent to the first side edge for passing therethrough the materials being mixed.

Preferably, the passage means comprises openings aligned with each other in a direction parallel to the vertical axis of rotation of the impeller blade, and the second side edge has alternate raised and recessed portions, the raised portions being aligned vertically with the corresponding openings and the recessed portions each being located generally at a level between each of the openings.

The present invention also provides a method for producing a sherbet-like composition for scrubbing and cleaning a substrate, comprising the steps of mixing a liquid chemical agent and pure water in a predetermined mixing ratio to form a mixture, and then supercooling the mixture uniformly therethroughout at a predetermined temperature lower than the freezing point of the water and greater than that of the chemical agent while stirring the mixture so that the water changes into snow ice grains a sherbet-like composition including the snow ice grains and the liquid chemicals.

Preferably, the step of providing the sherbet-like composition can further comprise the step of controlling the mixing ratio and/or the degree of supercooling of the mixture so that produce the snow ice particles produced have a predetermined size, and thus the sherbet-like composition produced has a predetermined consistency.

Preferably, the size of each of the snow ice particles is less than 200 micron.

Preferably, the stirring step further includes the steps of creating vortices in the mixture, growing the vortices and diffusing the grown vortices in the mixture.

The chemicals may include organic chemicals, alkaline chemicals, acid chemicals or any combination thereof.

The present invention also provides an apparatus for producing a sherbet-like composition, comprising a mixing vessel for mixing chemicals and pure water in a predetermined mixing ratio to form a mixture, means for supercooling the mixture uniformly at a predetermined temperature lower than the freezing point of the pure water and greater than that of the chemicals in a manner so as to form snow ice grains in the mixture, an impeller blade having a generally vertical axis of rotation for stirring the mixture uniformly within the mixing vessel to produce a sherbet-like composition having characteristics suitable for cleaning the substrate, the impeller blade having side edges which are each located so that there is a gap between each edge and the inner wall of the mixing sufficient to prevent the edges from coming into contact with the inner wall of the mixing vessel during the rotation of the impeller blade.

Preferably, the impeller blade comprises a contoured plate member having first and second side edges located opposite from the axis of rotation, the first side edge extending in a direction parallel to the vertical axis of rotation of the impeller and the second side edge being formed to have a sawtooth waveform shape. The impeller blade has passage means extending in a direction parallel to the vertical axis of rotation and located adjacent to the first side edge for passing therethrough the materials being mixed.

Preferably, the passage means comprises openings aligned with each other in a direction parallel to the vertical axis of rotation of the impeller blade, and the second side edge has alternate raised and recessed portions, the raised portions being aligned horizontally with the corresponding openings and located so that there is a gap between each of the raised portions of the second side edge and the inner wall of the mixing vessel, and the recessed portions each being located generally at a level between each of the corresponding openings.

Preferably, the gap between the first edge and the inner wall of the mixing vessel is less than the gap between each of the raised portions of the second edge and the inner wall of the mixing vessel.

The method according to the present invention further comprises the step of detecting a stirring torque in the mixture within the mixing vessel and controlling the level of supercooling of the mixture in accordance with the detected torque in a manner so as to vary the characteristics of the sherbet-like composition as desired.

According to the first-mentioned substrate cleaning method of the present invention, during the relative movement between the sherbet-like composition and the substrate, the liquid on the substrate surface (for example, the pure water on the substrate surface after CMP) that tends to attract dust particles thereonto can be replaced with liquid organic chemicals. Thus resulting in reduction of the adhesion force between the particles and the substrate surface. In this case, it is possible to clean the substrate surface in an easy and efficient manner by urging the sherbet-like composition having the desired consistency against the substrate surface to cause it to flow over the substrate in such a manner that the particles can become entrapped in or attached to the sherbet-like composition, thereby enabling the particles to be removed from the surface. In contrast to the conventional scrubbing cleaning process, the above-described "entrapping" process relies largely on the unique characteristics of the sherbet-like composition, i.e., the chemical action of the organic liquid chemical agent as well as the controlled consistency of the agent. Accordingly, any adverse effect on the substrate surface can be avoided.

The substrate cleaning method according to a second embodiment of the present invention relies on the fact that the freezing point of the chemical agent is lower than that of the pure water ("depression of the freezing point" theory). More specifically, according to the above invention, the pure water can be supercooled while a formation of bulk ice can be prevented by agitating and supercooling the mixture consisting of the pure water and the chemical agents so as to solidify the pure water while at the same time to prevent the chemical agents from being solidified. This enables the efficiency of producing a sherbet-like composition with a desired hardness consisting of the snow ice particles having a predetermined size and the chemical agents in a liquid phase to be enhanced, as compared with a mere cooling process described above. Further, by urging such a sherbet-like composition against the surface of the substrate, the substrate can be effectively cleaned. Control of the mixing ratio and the level of supercooling of the mixture can result in the production of a sherbet-like composition which is in a gel form and contains the snow ice particles having a predetermined size.

In accordance with the teachings of the present invention, the cleaning system of the present invention can carry out either the conventional scrubbing cleaning process or the "entrapping" cleaning process of the present invention, depending on the type of the substrate to be cleaned. The cleaning system according to the present invention has the advantage that it can produce a sherbet-like composition which can appropriately clean a particular substrate without any modification and additions having to be made, although it is necessary to clean the system using the pure water as cleaning water. More particularly, rotation of the impeller within the mixing vessel while the cleaning water is supplied thereinto will enable the mixing vessel and the impeller to be cleaned. Then, the cleaning water can be passed through the substrate cleaning unit, thereby making it possible to clean the cleaning unit in an easy and time saving manner.

BRIEF DESCRIPTION OF THE DRAWINGS

FIG. 1a is a side elevational view of a cleaning system according to the present invention.

FIG. 1b is a front view of the cleaning system shown in FIG. 1a.

FIG. 4c is a plan view of the cleaning unit taken along the line IV—IV of FIG. 4a.

FIG. 10b is a front view of the cleaning unit shown in FIG. 10a.

FIG. 11b is a front view of the cleaning unit shown in FIG. 11a.

DETAILED DESCRIPTION OF THE INVENTION

Several embodiments of the present invention will now be described with reference to FIGS. 1 to 11 of the accompanying drawings. In the following description, the "particles" in the phrase "particles to be removed" is to be broadly construed as meaning the unwanted particles adhering to the substrate surface which are to be removed from the surfaces thereof.

A first embodiment of a cleaning system according to the present invention will be described hereinafter, in conjunction with for example a post-CMP or post-ashing semiconductor substrate wafer cleaning operation.

A substrate cleaning system 1 according to the present invention generally comprises a sherbet-like cleaning composition making unit 10 and a substrate cleaning unit 11 located immediately below the unit 10. During operation of the cleaning system, a sherbet-like composition produced in the unit 10 is fed by gravity through a supply line 13 into the cleaning unit 11 for cleaning of the substrate.

Figure 2:
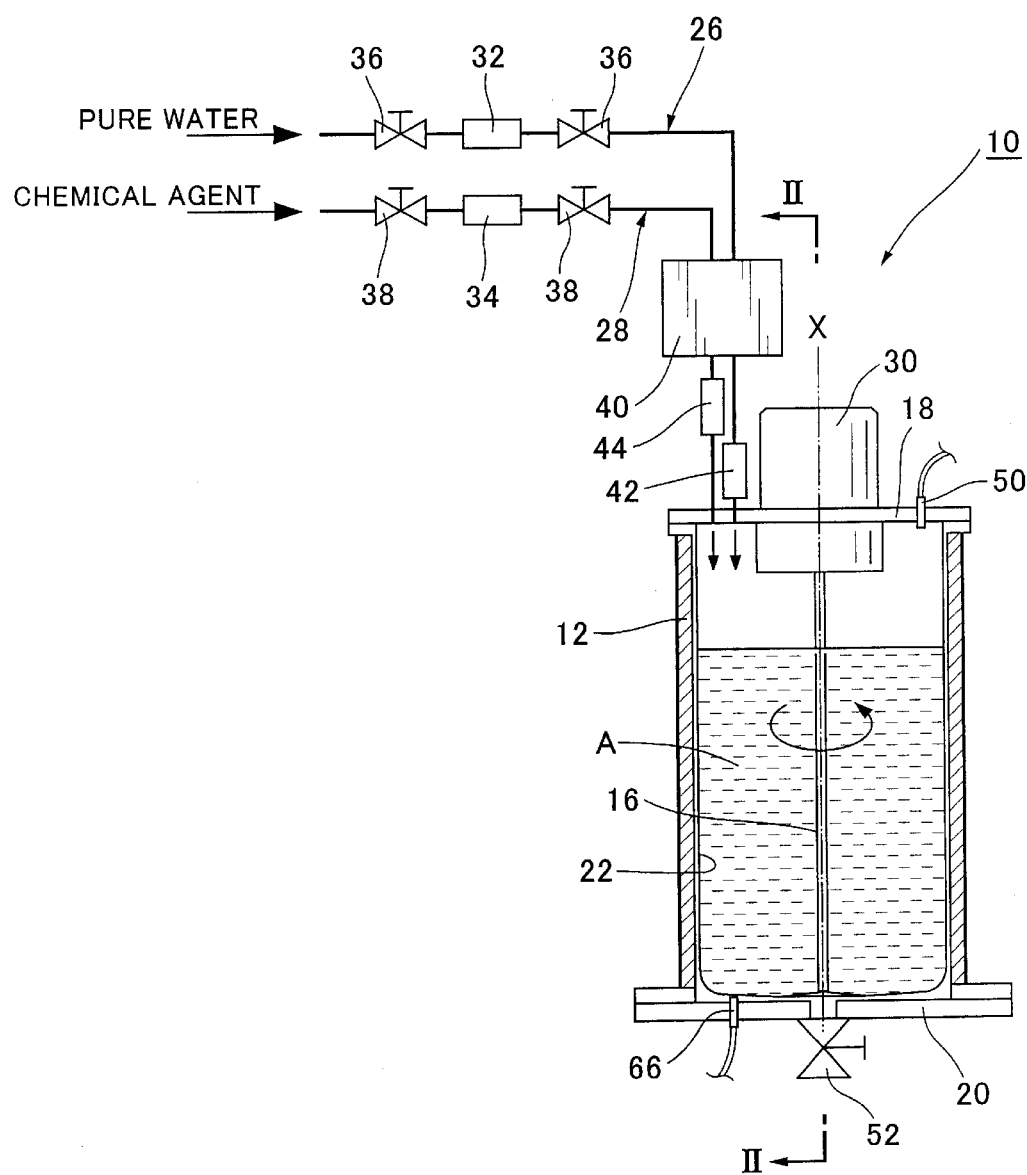
FIG. 2 is a schematic representation of a first embodiment of a sherbet-like composition producing unit of the cleaning system according to the present invention.
Figure 3:
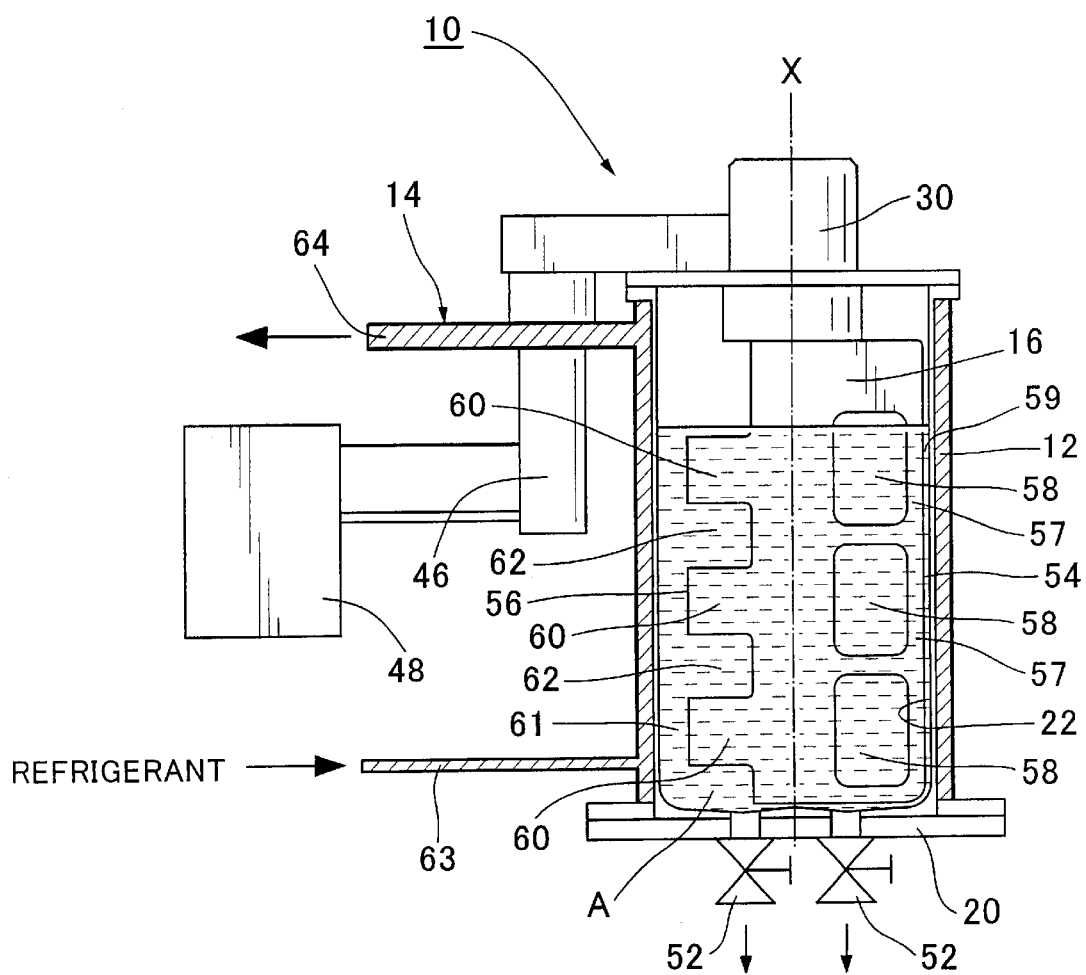
FIG. 3 is a view similar to FIG. 2 taken along the line II—II thereof, clearly showing a unique impeller of the sherbet-like composition producing unit shown in FIG. 2.

As shown in FIGS. 2 and 3, the sherbet-like composition producing unit 10 comprises a mixing vessel 12 for mixing a chemical agent and pure water in a predetermined mixing ratio to form a mixture A, supercooling means 14 located outside the mixing vessel for supercooling the mixture A within the mixing vessel 12 uniformly therethroughout at a predetermined temperature lower than the freezing point of the pure water and greater than that of the chemical agent and, an impeller blade 16 having a generally vertical axis of rotation for uniformly stirring the mixture A within the mixing vessel 12 to produce a sherbet-like cleaning composition.

The substrate to be cleaned may include a semiconductor wafer, a glass substrate for a liquid crystal display (LCD), a glass substrate for a plasma display panel (PDP) or the like.

The chemical agent may include organic chemicals, alkaline chemicals, acid chemicals, or any combination thereof.

The organic chemicals may be used to provide a chemical cleaning action to reduce surface tension force or an intermolecular force of liquids such as water which can contribute to the adhesion of the particles to the substrate surface. These organic chemicals may include alcohol, isopropyl alcohol (IPA).

The alkaline chemicals may provide for zeta potential control to cause the particles to be electrochemically repelled from the substrate surface to result in provide for chemical cleaning of the substrate. In this respect, a solution of ammonia is preferable. For example, after the CMP process, the substrate typically has a slurry or colloidal suspension of silica particles remaining over the oxide film thereof. When the substrate is placed in a diluted $NH_4OH$ solution, such diluted $NH_4OH$ solution is effective in electrochemically repelling the slurry particles from the substrate silicon dioxide surface as the slurry particles have the same polarity as the oxide film of the substrate. Thus, the particles can be prevented from being re-adhered to the substrate surface. As explained above, use of the alkaline chemicals can effectively remove the remnant slurry particles from the substrate surface.

The acid chemicals may provide chelate effect to prevent the particles, metallic ions and the like from adhering to the substrate surface. Organic acids, for example, an oxalate acid, citric acid and acetic acid, are preferably used as the acid chemicals.

The pure water to be used in cleaning the substrate contains an amount of impurities less than a predetermined value, and can be deionized water (D.I. water) having, for example, a resistivity of greater than about 15 MΩ·cm at 25° C. Ultrapure water can be used as well.

As shown in FIG. 2, the mixing vessel 12 can be of a double wall construction having an outer wall 21 and an inner wall 22, a closure 18 and a bottom plate 20. Preferably, the inner wall 21 is made of a material which prevents leakage of foreign matter into the mixture A in the mixing vessel 12. The closure 18 carries a rotating propeller shaft 30 connected to the impeller 16 which will be described below. A pure water supply line 26 extends through the closure 18 so that fluid can be supplied between a pure water source and the interior of the mixing vessel and liquid chemical agent supply line 28 also extends through the closure 18 so that fluid can be supplied between a liquid chemical agent source and the interior of the mixing vessel. The pure water supply line 26 and the chemical agent supply line 28 are provided with flow control devices 32 and 34, flow control valves 36 and 38 and filters 42 and 44, respectively. It should be noted that the pure water and chemical agent supply lines 26 and 28 are also provided with a common heat exchanger 40 which can be used to cool both the pure water and the liquid chemical agent in a heat exchange between the pure water and liquid chemicals agent and a flow of liquid waste into which a sherbet-like cleaning mixture is changed into after cleaning. Such liquid waste still remains at a relatively low temperature. By this arrangement, the pure water and liquid chemical agent are adapted to be supplied via their respective lines 26 and 28 to the mixing vessel 12 in a predetermined mixing ratio defined by the flow control devices 32 and 34 and with any impurities contained therein removed therefrom by their respective filters 42 and 44.

As clearly shown in FIG. 3, the propeller shaft 30 is connected to a servomotor 46 which in turn is connected to servo motor drive and computer-aid controller 48. The servomotor 46 can be operated to rotate the propeller shaft 30 and thus the impeller 16 within the mixing vessel 12. During the mixing process, the controller 48 can detect the output torque of the servomotor 46 by which the impeller 16 is rotated to agitate the mixture A within the mixing vessel 12, and control the operation of supercooling means 14 in the form of a refrigerant circuit wherein a refrigerant such as any ozone-friendly Freon substitute flows into an inlet 63 of the vessel, between the outer and inner walls 21 and 22 thereof, and then out of an outlet 64 so that it may keep the mixture of the pure water and the liquid chemical agent at a temperature which is below the freezing point of the pure water and above that of the chemical agent employed. More specifically, the controller 48 is operable to control the flow rate of the refrigerant in a manner so as to attain sherbet-like mixture, having the desired characteristics, the characteristics of the sherbet-like composition including, among others, the scrubbing property defined mainly by the size of snow ice grains and the consistency or "entrapping" property defined mainly by the ratio of a liquid phase to a solid phase of the sherbet-like composition. Preferably, a temperature sensor 66 is attached to the bottom plate 20 of the mixing vessel 12 for sensing the temperature of the mixture A.

As shown in FIG. 2, an optical sensor 50 is provided for sensing the level of the mixture A in the mixing vessel 12. An outlet valve 52 is provided for supplying the sherbet-like mixture resulting from being mixed in the mixing vessel 12 through a conduit 13 to the cleaning unit 11 located immediately below the mixing vessel 12 for cleaning.

Preferably, the impeller 16 is in the form of a contoured plate member mounted for rotation about an axis of rotation X extending vertically, as clearly shown in FIG. 2, and having first and second side edges 54 and 56 having respective agitating radii defined between the rotational axis and these respective edges. The impeller 16 may preferably be made of SUS steel, although any suitable material can be used as long as it has a strength sufficient to withstand the stirring torque applied on the mixture in the mixing vessel. At least one of the side edges 54 and 56 of the impeller 16 can be positioned closer to the inner wall 22 of the mixing vessel than the other one in order to preclude the possibility of excessive growth of ice on the inner wall of the mixing vessel 22. Rotating speed of the impeller can be adjusted as appropriate.

More particularly, as viewed in FIG. 3, the first and second side edges 54 and 56 are located opposite from the axis of rotation X. The first side edge 54 extends generally in a direction parallel to the vertical axis of rotation and the second side edge 56 is formed to have the shape of a sawtooth waveform and comprises alternate raised portions 60 and recessed portions 62. Preferably, the spacing designated at 59 between the first side edge 54 and the inner wall 22 is less than a spacing 61 between the raised portions 60 of the second edge 56 and the inner wall 22 of the mixing vessel 12, and may have a size ranging from between about 0.5 mm to 2.0 mm. The impeller 16 has passage means in the form of a plurality of (three, for example) separated openings 58 vertically aligned with respect to each other and disposed between the axis of rotation X and the side edge 54 for allowing the mixture to pass therethrough without agitation of the mixture. The impeller also has a vertical side edge portion 57 adjacent to the first side edge 54 for agitating the mixture, thus helping to create vortices in the mixture. Defined between the separate openings 58 are relatively narrow horizontally extending portions, as shown in FIG. 3. The raised portions of the side edge 56, which correspond in number to the number of the openings 58, are aligned horizontally with the corresponding openings 58. As shown in FIG. 3, the two recessed portions 62 of the side edge 56 are aligned horizontally with the corresponding narrow portions between the opening 58. Preferably, the spacing 61 is approximately half the width of the bottom of each recessed portion 62 of the side edge. Through on experiment it has been found that spacing having such a width may contribute to improved diffusion of the vortices in the mixture which will be described hereinafter.

Figure 4A:
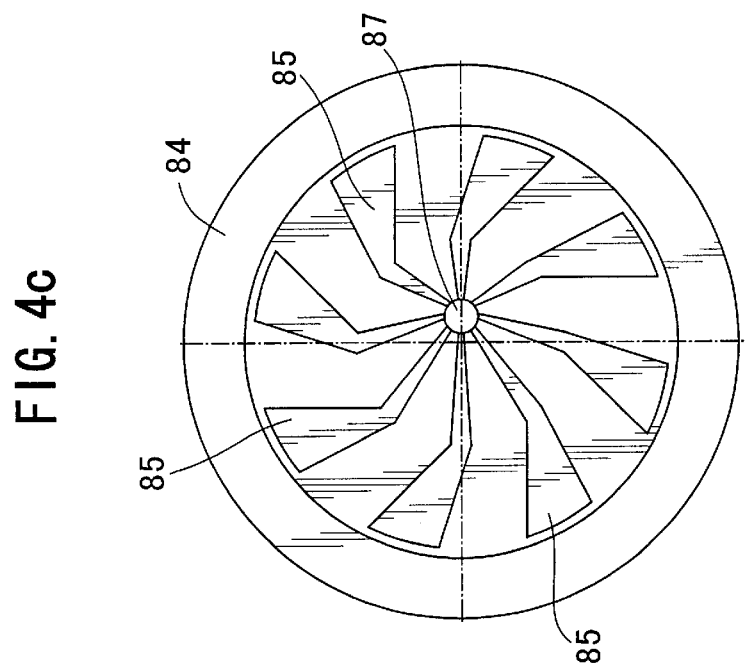
FIG. 4a is a side elevational view of a first embodiment of a cleaning unit of the cleaning system according to the invention, showing the cleaning unit after or before cleaning of the substrate.
Figure 4B:
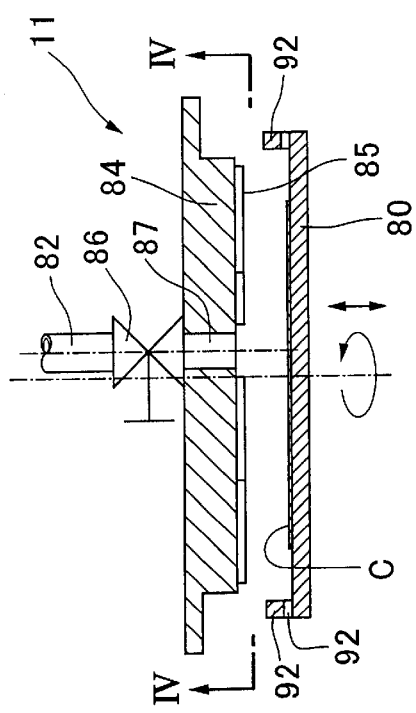
FIG. 4b is a side elevational view of the cleaning unit shown in FIG. 4a, showing the cleaning unit during cleaning of the substrate.
Figure 4C:
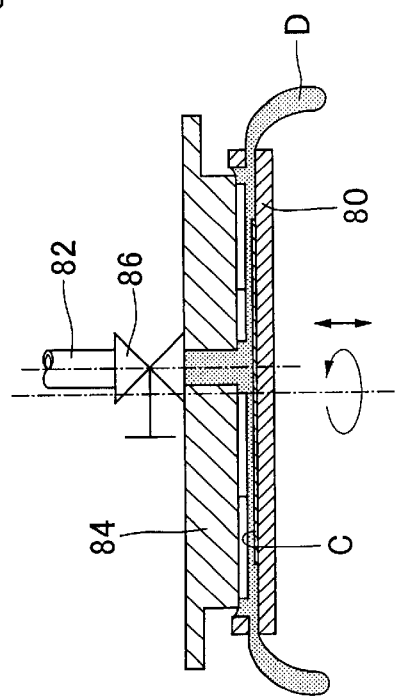

Referring now to FIG. 4, the cleaning unit 11 will be described. The cleaning unit 11 generally comprises holder means 80 for holding a substrate to be cleaned, supply means 82 for supplying to the substrate a sherbet-like composition including snow ice grains and chemical agent for cleaning of the substrate, and urging means 84 for urging the supplied sherbet-like mixture against the surface of the substrate C so that the mixture can move under pressure relative to the substrate along the surface thereof to clean it.

The holder means comprises a holder plate 80 on which the substrate is placed generally horizontally. The holder plate 80 is provided around the circumference thereof with an annular rim 92 for blocking the flow of the mixture. The annular rim 92 has apertures 93 disposed diametrically opposite to each other through which a portion of the flow of mixture expelled from between the holder means 80 and the urging means 84.

The urging means 84 is in the form of a circular pressure plate which is rotatable about an axis of rotation 95. The pressure plate 84 has screw means comprising screw member 85 on the underside thereof comprised of blade members disposed in a spiral pattern and is substantially coextensive with the substrate on the holder plate 80. The pressure plate 84 has an aperture 87 located eccentrically to the axis of rotation 95 thereof and centered on the screw means 85. The pressure plate and thus the screw member 85 can be rotated at a controlled rpm.

The supply means 82 comprises a supply conduit which is connected to the supply line 13 and is adapted to supply the flow of the sherbet-like mixture through the aperture 87 onto the substrate surface. The flow rate of the sherbet-like mixture can be adjusted by means of a flow control valve 86 provided on the tube 82. The holder plate 80 is arranged in such a manner that it can be moved vertically by means of a lifting mechanism (not shown). Prior to the conducting of cleaning procedure, the holder plate 80 can be lowered to a position suitable for reception of the substrate to be cleaned (see FIG. 4a) and then lifted to a cleaning position as shown in FIG. 4b. After cleaning the substrate, the holder plate 80 can be lowered to allow removal of the cleaned substrate.

Next, the method for producing the sherbet-like mixture using the cleaning system as described above will be described hereinafter.

Firstly, depending on the type of the substrate and depending on how strongly the particles are adhered to the substrate surface, one of two cleaning processes, i.e., one process utilizing the scrubbing characteristics of the sherbet-like mixture and the other process utilizing the "entrapping" characteristics of the sherbet-like mixture. In this connection, the desired characteristics of the sherbet-like mixture (the desired size of the snow ice in the case of the first-mentioned process versus the desired consistency of the mixture in the case of the second-mentioned process) depends on the process selected. For the substrate subjected to for example, the CMP process, isopropyl alcohol (IPA) can be used as a chemical agent for chemical cleaning because the particles are adhered more strongly thereby to the substrate surface than they are when the substrate is subjected to other process. In addition, for the substrate subjected the CMP process it is necessary to adjust the mixing ratio of IPA and pure water, the agitating speed and the amount of heat to be absorbed from the mixture. The snow ice grain size typically is below 200 microns although it often may depend on the type of the substrate to be cleaned, the degree of adhesion of the unwanted particles to the substrate surface and the like.

In operation, the pure water flow and the isopropyl alcohol flow passing through their respective lines 26 and 28 are filtered by the filters 42 and 44 and supplied into the mixing vessel 12 in a predetermined mixing ratio defined by the flow control devices 32 and 34.

The servomotor 46 is operated to rotate the propeller shaft 30 and thus the impeller 16 around the axis of rotation A in the mixing vessel 12 to stir the mixture of the pure water and IPA. Simultaneously, the mixture A is cooled uniformly by means of the external cooling means 14 at any suitable temperature which is below the freezing point (i.e., 0° C.) of the pure water and above the freezing point (i.e., −89.5° C.) of IPA and which in this case, is −50° C., for example.

Stirring of the mixture A causes generation of vortices V in the mixture A. During this process, the vortices will grow large and be diffused in the mixture A to thereby produce turbulence therein.

Figure 5:
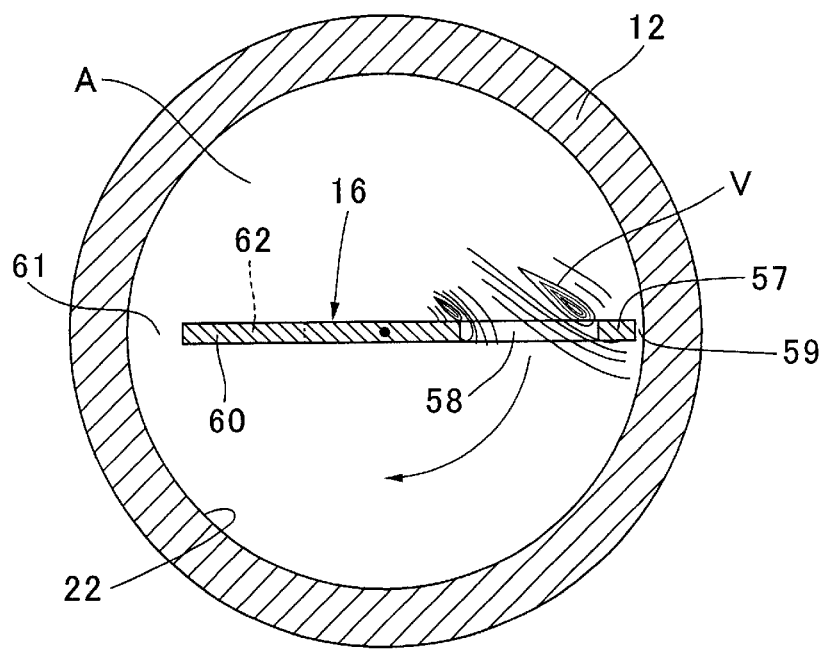
FIG. 5 is a cross sectional view of a portion of the sherbet-like composition producing unit, showing a vortex created by the impeller within a mixing vessel.
Figure 6:
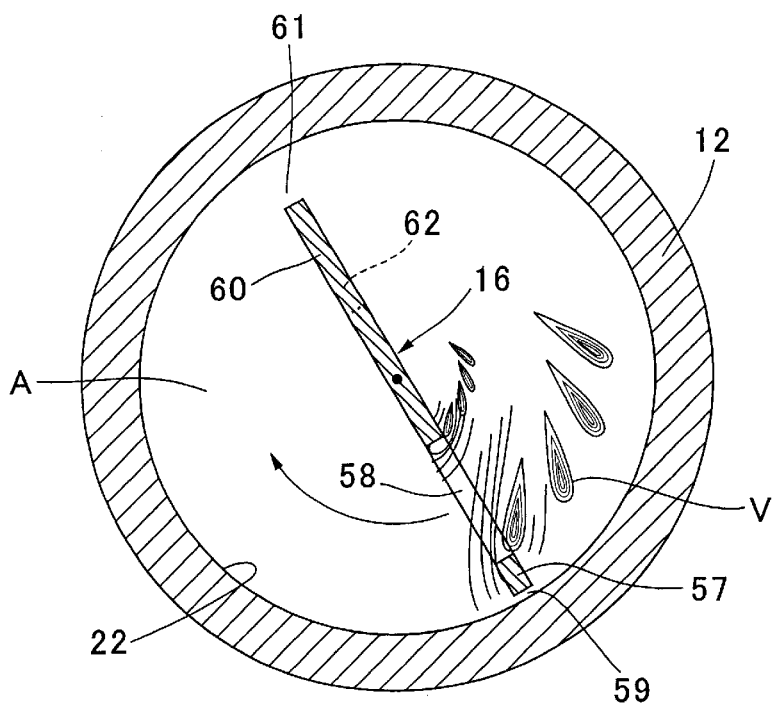
FIG. 6 is a cross sectional view of a portion of the sherbet-like composition producing unit, showing a vortex being grown.
Figure 7:
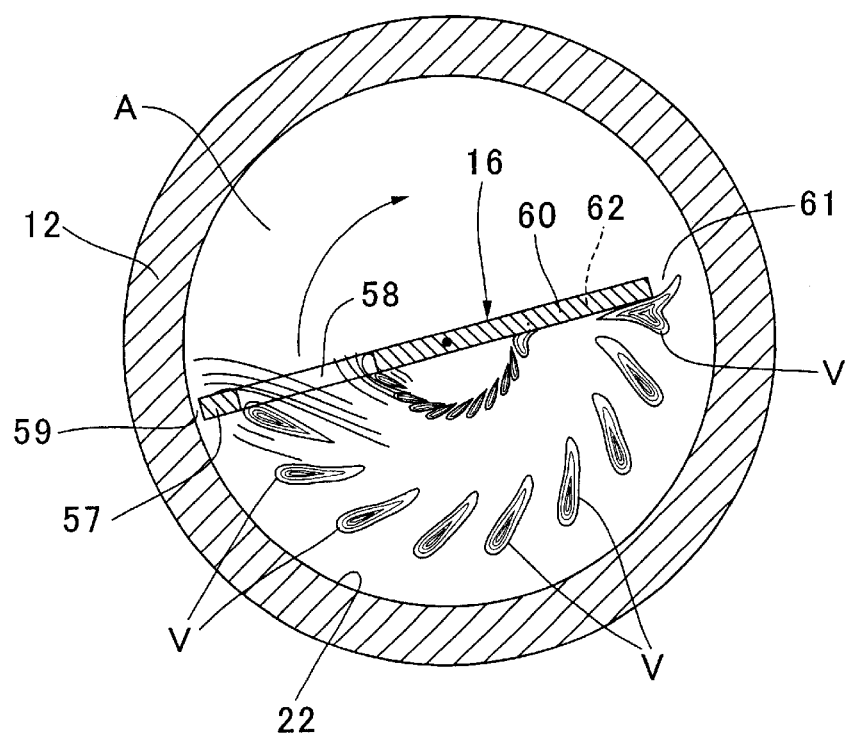
FIG. 7 is a cross sectional view of a portion of the sherbet-like composition producing unit, showing vortices being distributed within the mixing vessel.

Such a process will be described in detail with reference to FIGS. 5 to 7. As a result of the rotation of the impeller 16, the mixture A is stirred by the agitation of the vertical impellers, side edge portion 57 and passes through the openings 58 in the impeller so as to create a spiral flow in one direction in the mixture A. Then, as shown in FIGS. 6 and 7, the raised portions 60 and the portions 62 of the second side edge 56 of the rotating impeller 16 are operated to diffuse the vortices V being grown. More specifically, the vortices V are guided by the raised portion 60 and grown and diffused while being passed through the spacing 61 and the recessed portions 62. In this way, the ice on the inner wall 22 of the mixing vessel 12 is prevented from growing, thereby allowing the mixture A to be cooled uniformly therethroughout. As a result, the pure water can undergo the phase change to thereby become ice, while liquid phase of the chemical agent is maintained, thereby resulting in efficient production of the sherbet-like mixture suitable for cleaning the substrate.

As described above, the servomotor drive and controller 48 is adapted to detect the output torque of the servomotor 46 to determine the stirring force applied to the mixture A by the rotating impeller 16 in the mixing vessel 12. The stirring force can vary depending on the amount of the mixture A in the mixing vessel 12. Accordingly, it is necessary to measure the amount of the mixture A by means of the optical sensor 50 and control the operation of the refrigerator (not shown) in accordance with this measurement results in a manner so as to adjust the heat to be absorbed from the mixture, thereby maintaining the uniform characteristics of the sherbet-like mixture. For the manufacture of the sherbet-like mixture having satisfactory characteristics, both the total amount of heat absorption and the heat absorption rate per unit time are equally important factors.

In view of the fact that during the producing of the sherbet-like mixture, the phase of the pure water in the mixing vessel 12 continues to be changed to form ice while the liquid phase of the chemical agent is maintained, the ratio of the snow ice to the chemical agent in the mixture A varies over time, which variation in turn can vary the stirring torque applied to the mixture over time. To produce the sherbet-like mixture having the desired characteristics, it is important to allow for such torque variation.

The stirring process as described above can cause a phase to change in the pure water around the openings 58 near the vortices V. More specifically, the mixture is maintained in its liquid state near the inner wall of the vessel 12, 22 while being supercooled and changed from the liquid phase to the solid phase at a place near the openings 58, in particular near the axis of rotation X of the impeller 16. As a result, it is possible to substantially prevent a reduction in the cooling efficiency, i.e., the efficiency of the production of the sherbet-like mixture as the present system can minimize the tendency of ice to form on the inner wall 22 of the mixing vessel 12, which ice could limit the cooling effect to be minimized. Thus, the efficient production of the sherbet-like mixture having the desired characteristics can be attained.

The substrate cleaning process using the sherbet-like mixture D thus produced will be described hereinafter.

Firstly, with the valve 52 opened, the sherbet-like mixture D is supplied by gravity via the supply line 13 to the cleaning unit 11 in which the substrate to be cleaned is placed on the holder plate 80.

Thereafter, in order to carry out the scrubbing cleaning process utilizing on the scrubbing characteristics of the sherbet-like mixture, the pressure plate is moved to urge the sherbet-like mixture D against the surface of the substrate so that the mixture can move under pressure relative to the substrate along the surface thereof to clean it. During this process, the chemical agent in the mixture can conduct chemical cleaning of the substrate whereas the ice grains can conduct mechanical cleaning of the substrate.

Figure 8:
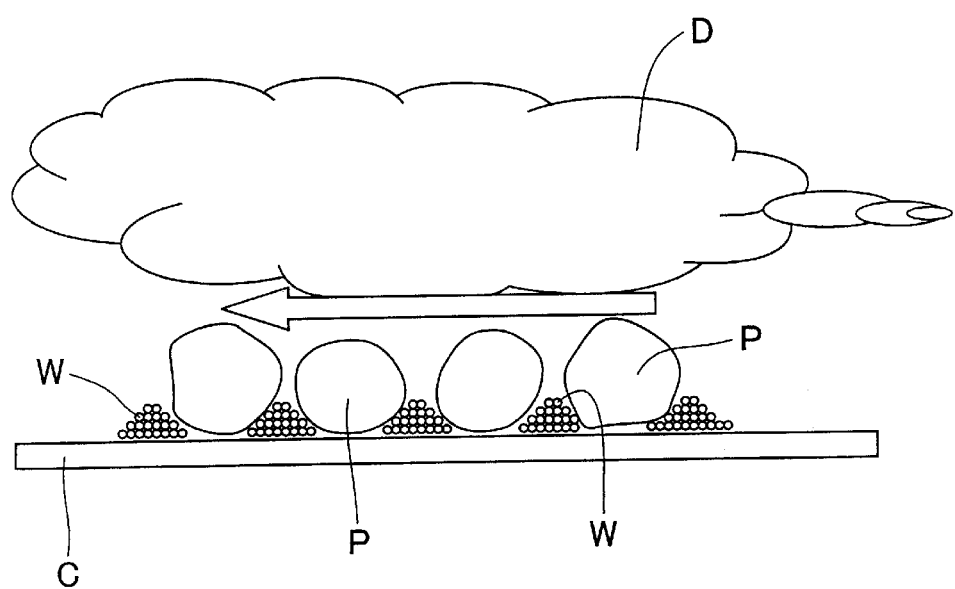
FIG. 8 is a schematic representation showing how a first embodiment of a method for cleaning the substrate according to the present invention is practiced.

Referring now to FIG. 8, the new "entrapping" cleaning method according to the present invention will be described in detail. When the sherbet-like mixture D is moved horizontally relative to the substrate C along the surface thereof, the liquid organic chemical agent in the sherbet-like mixture D replaces the pure water W on the substrate surface. For example, it is known that an appreciable volume of the pure water remains on the substrate surface after CMP. Generally, the surface tension force between the pure water and the substrate surface is equal to about 0.008 Kgf/m whereas the surface tension force between IPA and the substrate surface is equal to about 0.002 Kgf/m which is less than about one-third of that of the pure water. Accordingly, the adhesion force between the particles and the surface of the substrate C is greatly reduced or eliminated due to the replacement resulting from the difference between the surface tension forces of the pure water and the IPA, it is likely the particles will be dislodged from the substrate surface. Under the circumstances, the sherbet-like mixture D having the desired sticking property can be moved over the substrate surface in a direction parallel to the plane of the substrate as indicated by the arrow in FIG. 8. During the movement of the sherbet-like mixture, the particles P become entrapped in or attached to the sherbet-like mixture D, resulting in the particles being removed from the surface of the substrate. This "entrapping" cleaning process provides an advantage over the conventional scrubbing cleaning process in that it cleans a substrate with less resulting adverse effect on the substrate surface than the conventional process does. Alternatively, the substrate may be rotated or reciprocated during cleaning thereof.

It will be appreciated by those skilled in the art that in the case where the sherbet-like mixture is urged against the substrate surface with a great force, the scrubbing cleaning characteristic of the sherbet-like mixture may become dominant in the cleaning process, whereas if the sherbet-like mixture is urged against the substrate surface with a small force, the "entrapping" cleaning characteristic of the sherbet-like mixture may become dominant in the cleaning process.

The invention can be adapted in accordance with different types substrate. In order to clean a different type of substrate, the pure water can be used as cleaning water for cleaning the units 10 and 11. The water is fed through the lines 26 and 28 into the mixing vessel 12 in which the impeller 16 is rotating. As a result, the cleaning water is stirred within the vessel without freezing and then discharged into the substrate cleaning unit 11. Thus, the cleaning of the lines 26 and 28, mixing vessel 12, impeller 16, line 13 and unit 11 enable a substrate cleaning to be accomplished in an easy and time saving manner without having to perform manual cleaning operations.

Figure 9:
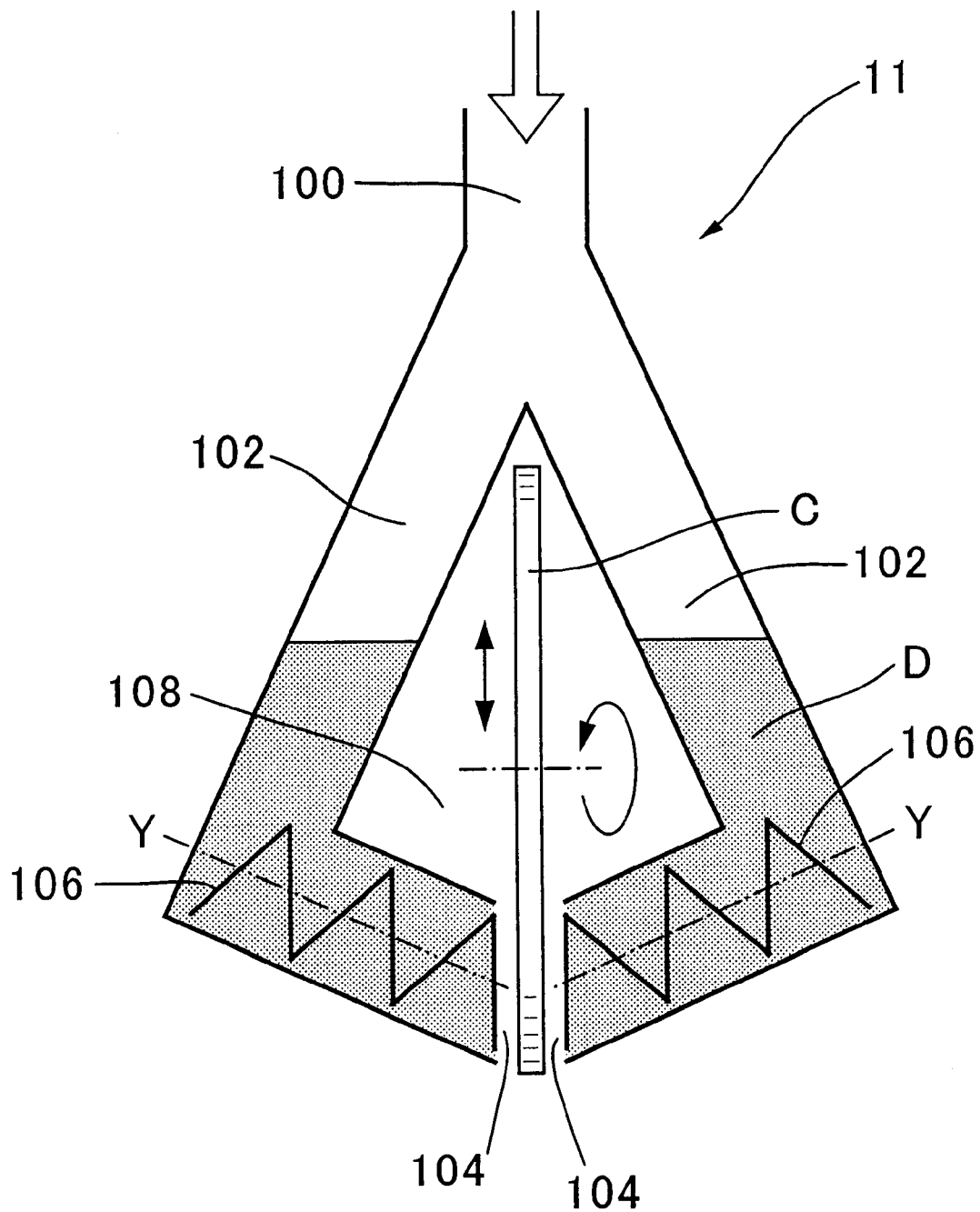
FIG. 9 is a schematic representation of a second embodiment of the cleaning unit of the cleaning system according to the present invention, showing a forked feeding vessel for feeding the sherbet-like composition to the substrate surfaces.

A second embodiment of the present invention will now be described below. In the following description, elements like or corresponding to elements of the first embodiment are indicated by the same reference numerals as those used to indicate such like on corresponding elements in the first embodiment. It is believed that no description of elements like those in the first embodiment, for example, the sherbet-like mixture producing unit 10, is required. Also, the second embodiment can carry out either the scrubbing cleaning process or the "entrapping" cleaning process. The following description will focus on the unique features of the second embodiment of the present invention. FIG. 9 is a schematic representation of the second embodiment of the cleaning unit of the cleaning system according to the present invention.

The unique features of the second embodiment, as shown in FIG. 9, include supplying means for supplying the sherbet-like mixture from the unit for producing the mexture to the opposite sides of the vertically disposed substrate C for cleaning the substrate.

More specifically, the supply means comprises a bifurcated tube 100 for containing the sherbet-like mixture. The bifurcated tube 100 includes two dog-leg shaped tube legs 102 which are arranged so as to define therebetween a space 108 for receiving the substrate C to be cleaned in a vertical position. The substrate can be disposed for rotational and/or reciprocating movement as indicated by arrows in FIG. 9 and which each of the two legs 102 has an open outlet end 104. As can be appreciated by those skilled in the art, the substrate C is rotated by means of rotating means (not shown) and/or reciprocated by reciprocating means (not shown). Each tube leg 102 has a screw conveyor 106 provided in a portion thereof for advancing the sherbet-like mixture toward the opposite surfaces of the substrate C. The spacing between each of the opposite substrate surfaces and its corresponding open outlet end 04 is such that the sherbet-like mixture being discharged is urged against the substrate surfaces to clean them. Each of the screw conveyors 106 comprises a spiral blade which is rotatable about its respective axis designated at Y and which is preferably oriented at a predetermined angle α in relation to the vertical plane of the side of the substrate. It is preferable that the angle α having a size ranging from between about 0 to 45 degrees.

By the arrangement of the second embodiment as shown in FIG. 9, both side surfaces of the substrate C can be cleaned at the same time by means of the sherbet-like mixture which are continuously delivered through the outlet ends 104 of by the screw conveyors 106 of the tube 100, thus providing an efficient and effective cleaning of the substrate C.

Still another embodiment of the cleaning system of the present invention will be described with reference to FIG. 10 which is a schematic representation of a modified cleaning unit of the present invention.

Figure 10B:
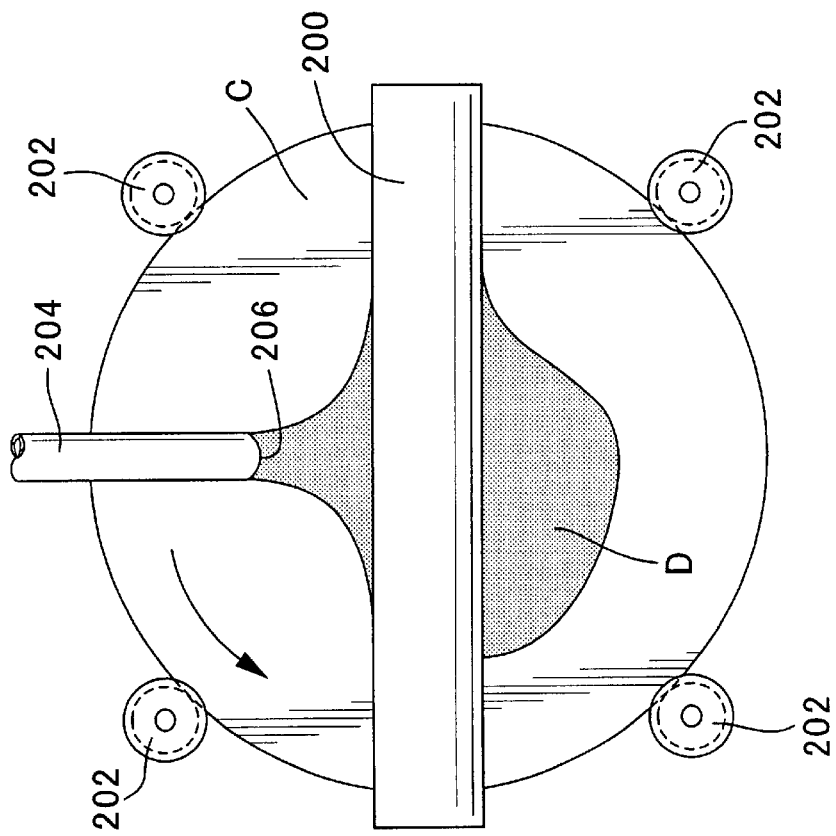
Figure 10A:
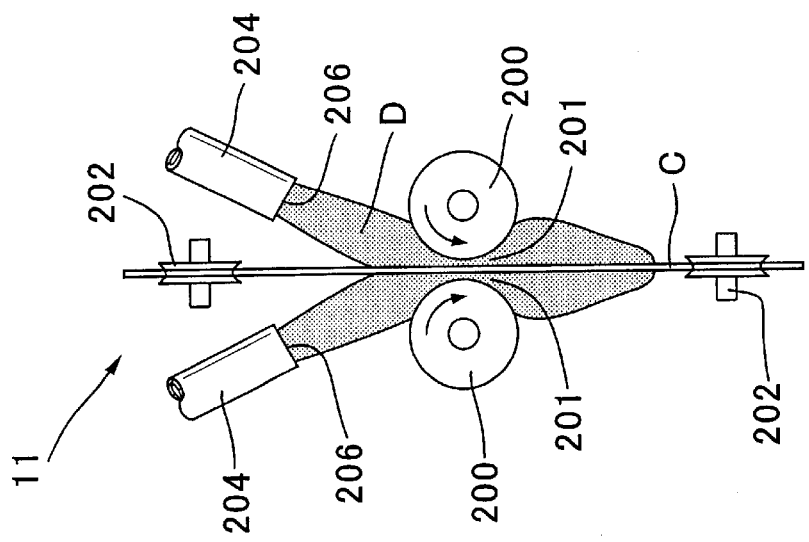
FIG. 10a is a side elevational view of a third embodiment of the cleaning unit of the cleaning system according to the present invention.

The unique feature of the third embodiment, as shown in FIG. 10, is supplying means in the form of a pair of parallel rotating rolls 200 for pushing or urging the sherbet-like mixture toward the opposite surfaces of the vertically disposed substrate C to clean them.

The pair of parallel rolls 200 are disposed at opposite sides of the substrate C and each roll is spaced apart a predetermined distance designated at 201 from the substrate surface C. The size of the spacing 201 depends on the type of the substrate, which type of cleaning process is used (the scrubbing cleaning process or the entraining cleaning process), the quantity of the sherbet-like mixture supplied or the like. As shown in FIG. 10, four spinning chuck devices 202 are equally angularly spaced apart around the circumference of the substrate C and arranged to engage and rotate the substrate C in a direction as indicated by the arrow in the figure about a horizontally extending axis of rotation during cleaning. Supplying means comprises supply tubes 204 each having an open discharge end 206 through which the sherbet-like mixture D is delivered into a nip defined between the corresponding rotating roll 202 and the substrate surface to be able to conduct cleaning of the substrate C.

By the arrangement of the third embodiment of the present invention, both of the side surfaces of the substrate C can be cleaned at the same time and the arrangement of the rolls 200, as shown in FIG. 10, facilitates servicing and maintenance thereof.

A further embodiment of the cleaning system of the present invention will be described with reference to FIG. 11, which is a schematic representation of a modified cleaning unit of the present invention.

Figure 11A:
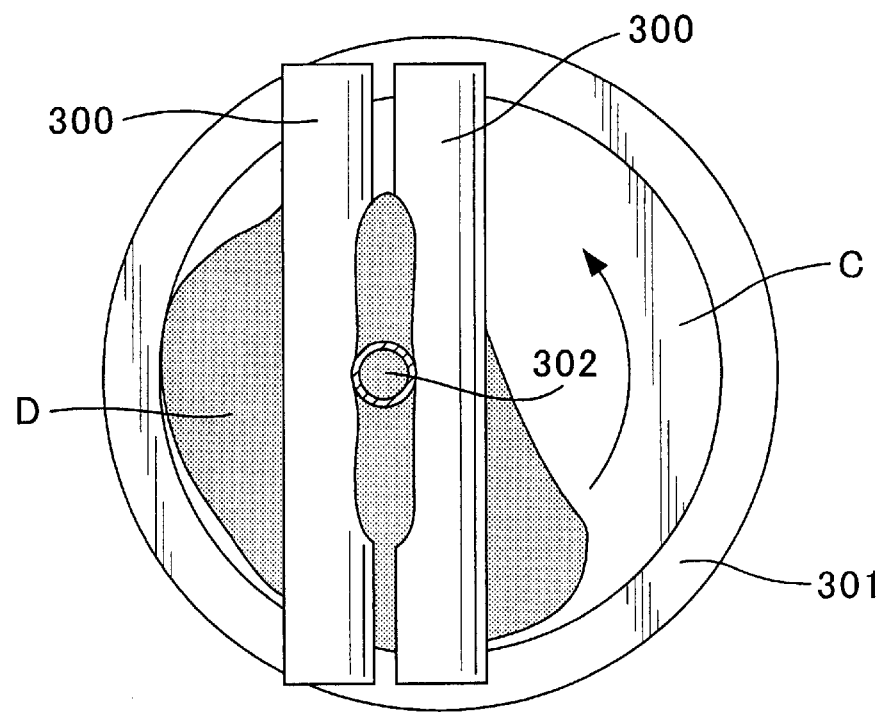
FIG. 11a is a side elevational view of a fourth embodiment of the cleaning unit of the cleaning system according to the present invention.
Figure 11B:
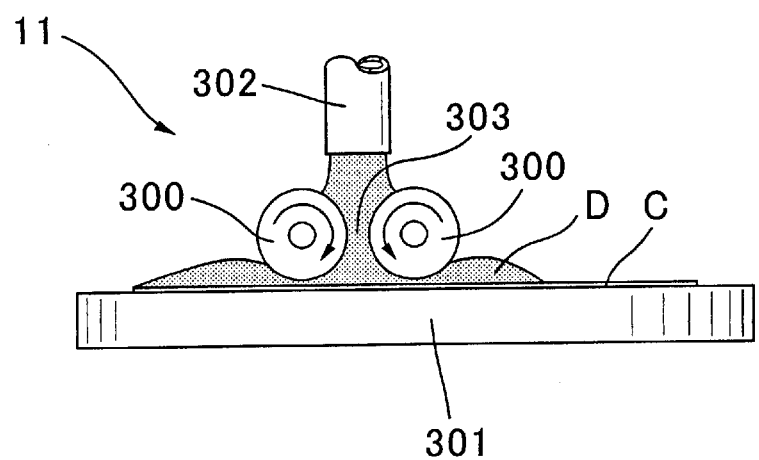

The unique feature of the fourth embodiment, as shown in FIG. 11 is a supplying means in the form of a pair of parallel rotating rolls 300 for pushing or urging the sherbet-like mixture toward one of the opposite surfaces of the horizontally disposed substrate C to clean it.

More specifically, the pair of parallel rolls 300 are disposed above one surface of the substrate C which is placed on a rotating plate 301 mounted for rotation about a vertically extending axis. The rolls 300 are spaced apart an adjustable distance indicated at 303 from each other and one of the rolls is offset from the other roll, as can be seen in FIG. 11a. The size of spacing 303 depends on the type of the substrate, which type of the above described cleaning processes (the scrubbing cleaning process or the entraining cleaning process) is used, the quantity of the sherbet-like mixture supplied or the like, as in the case of the second embodiment. The rolls 300 are disposed to be moveable toward and away from each other, to thereby adjust the spacing 303 therebetween. Supplying means 302 comprises a single vertically disposed supply tube 302 having an open discharge end through which the sherbet-like mixture D is delivered into a nip defined between the pair of rotating rolls 300 to be able to conduct cleaning of the substrate C. It can be appreciated by those skilled in the art that the offset arrangement of the rolls 300 as shown assures that the central portion of the substrate C is cleaned.

As described above, the arrangement of the fourth embodiment of the present invention allows the size of the spacing 303 to be adjusted and thus allows the adjustment of the quantity of the sherbet-like mixture to be supplied to the substrate surface, thereby allowing optimization of the cleaning of the substrate C. Also, the arrangement of the rolls 300 facilitates servicing and maintenance thereof.

While specific embodiments of the present invention have been described in detail, it should be understood that various changes and modifications may be made thereto without departing from the scope of the appended claims. For example, while in the illustrated embodiment the sherbet-like mixture is comprised of just one kind of chemical agent and pure water, it can be comprised of more than one kind of chemical agent more than one kind of and pure water depending on the type of the substrate and the level of contamination of the substrate surface, provided that alkaline chemicals and acid chemicals are not used together. In this way, the present invention provides a combination of the entrapping cleaning process and the conventional scrubbing cleaning process.

Additionally, the number of the openings 58 provided in the impeller 16 near the first side edge 54 thereof is not limited to three as shown in FIG. 3. Instead, any suitable number of the openings 58 can be provided in the present invention. Further, the size of, configuration and vertical length (the spacing between the top and bottom ends) of each opening 58 in the impeller 16 can be selected as appropriate. The second side edge 56 of the impeller 16 can have a curved or serpentine configuration so as to facilitate machining operations and the like as long as it provides the vortex diffusion function described above.

Further, in the illustrated embodiment the process of the present invention is carried out on a batch basis. More specifically, a batch of the sherbet-like mixture is produced by the sherbet-like mixture producing unit 10, if a large number of the substrates have to be cleaned. However, the substrate cleaning method and system of the present invention can employ a continuous process instead of the batch process. More specifically, the sherbet-like mixture can be produced continuously by the unit 10 and then supplied continuously via the conduit 13 to the unit 11 for cleaning of the substrate.

As can be appreciated by those skilled in the art, the present invention provides a new and novel "entrapping" cleaning process.

A method and apparatus for making a sherbet-like cleaning composition having the characteristics suitable for the type of the substrate to be scrubbed and cleaned have also been disclosed.

Further, a method and system for cleaning a substrate in an efficient and effective manner using such a sherbet-like cleaning composition have also been disclosed.

The substrate cleaning system according to the present invention can selectively employ the conventional scrubbing cleaning process and the "entrapping" cleaning process, depending on the type of the substrate to be cleaned.

What is claimed is:

1. A method for cleaning a substrate, comprising the steps of:

providing a sherbet-like cleaning composition consisting of snow ice crystal grains and a liquid organic chemical agent and moving the sherbet-like cleaning composition relative to the substrate to be cleaned along at least one of the surfaces thereof, said organic chemical agent of the composition being operable to reduce the adhesion of residual particles to said at least one surface of the substrate, and said sherbet-like cleaning composition having a consistency allowing the particles on said at least one surface of the substrate to be entrapped therein to thereby enable the particles to be removed from said at least one surface of the substrate, wherein said step of providing the sherbet-like composition comprises the steps of mixing the liquid organic agent and pure water in a predetermined mixing ratio in a mixing vessel to form a mixture, and then supercooling the mixture uniformly therethroughout at a predetermined temperature lower than the freezing point of the pure water and greater than that of the organic chemical agent while stirring the mixture in a manner permitting the pure water to grow into snow ice crystal grains, and wherein said stirring step comprises steps of creating vortices in the mixture, growing the vortices and diffusing the grown vortices in the mixture.

2. The method according to claim 1, wherein said step of providing the sherbet-like composition further comprises a step of controlling the mixing ratio and/or the degree of supercooling of the water so that the snow ice particles produced have a predetermined ratio by volume in the pure water, and thus the sherbet-like composition produced has a predetermined consistency.

3. A method for cleaning a substrate, comprising the steps of providing a sherbet-like cleaning composition consisting of snow ice crystal grains and a liquid organic chemical agent and moving the sherbet-like cleaning composition relative to the substrate to be cleaned along at least one of the surfaces thereof, said organic chemical agent of the composition being operable to reduce the adhesion of residual particles to said at least one surface of the substrate, and said sherbet-like cleaning composition having a consistency allowing the particles on said at least one surface of the substrate to be entrapped therein to thereby enable the particles to be removed from said at least one surface of the substrate, wherein said step of providing the sherbet-like composition further comprises the step of detecting a stirring torque applied on the mixture in the mixing vessel and controlling the degree of supercooling of the mixture in accordance with the detected torque in a manner so that the sherbet-like composition produced has a predetermined consistency.

4. A method for cleaning a substrate by means of a sherbet-like composition containing snow ice grains and a liquid chemical agent, comprising the steps of:

providing the sherbet by mixing the liquid chemical agent and pure water in a predetermined mixing ratio to form a mixture and supercooling the mixture uniformly therethroughout while stirring the mixture at a predetermined temperature lower than the freezing point of the pure water and greater than that of the chemical agent to produce a sherbet-like composition having characteristics suitable for scrubbing and cleaning the substrate, and urging the sherbet against at least one of the surfaces of the substrate while effecting relative movement between the sherbet-like composition and the substrate to scrub said at least one of the surfaces of the substrate to clean it, wherein said stirring step further comprises the steps of creating vortices in the mixture, growing the vortices and diffusing the grown vortices in the mixture.

5. The method according to claim 4, wherein said step of providing the sherbet-like composition further comprises the step of controlling said mixing ratio and/or the level of supercooling of the mixture so that the snow ice grains contained in the sherbet-like composition have a controlled size.

6. The method according to claim 4, wherein said chemical agent includes organic chemicals, alkaline chemicals, acid chemicals or any combination thereof.

7. The method according to claim 4, wherein during said cleaning of the substrate, the substrate is rotated and/or reciprocated.

8. A method for producing a sherbet-like composition for scrubbing and cleaning a substrate, comprising the steps of:

mixing a liquid chemical agent and pure water in a predetermined mixing ratio to form a mixture, and then supercooling the mixture uniformly therethroughout at a predetermined temperature lower than the freezing point of the water and greater than that of the chemical agent while stirring the mixture so that the water changes into snow ice grains to produce sherbet-like composition including the snow ice grains and the liquid chemicals, wherein each of said stirring step further comprises the steps of creating vortices in the mixture, growing the vortices and diffusing the grown vortices in the mixture.

9. The method according to claim 8 wherein said step of providing the sherbet-like composition further comprises the step of controlling the mixing ratio and/or the level of supercooling of the mixture so that the snow ice particles produced have a predetermined size, and thus the sherbet-like composition produced has a predetermined consistency.

10. The method according to claim 8, wherein said snow ice grains have a size of less than 200 microns.

11. The method according to claim 8, wherein said chemical agent includes organic chemicals, alkaline chemicals, acid chemicals or any combination thereof.

* * * * *